United States Patent
Kanazawa et al.

(10) Patent No.: US 11,165,409 B2
(45) Date of Patent: Nov. 2, 2021

(54) ACOUSTIC WAVE DEVICE, FILTER, AND COMPOSITE FILTER DEVICE

(71) Applicant: Murata Manufacturing Co., Ltd., Nagaokakyo (JP)

(72) Inventors: Tomio Kanazawa, Nagaokakyo (JP); Hiroshi Shimizu, Nagaokakyo (JP); Syunsuke Kido, Nagaokakyo (JP); Ryo Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 87 days.

(21) Appl. No.: 16/658,211

(22) Filed: Oct. 21, 2019

(65) Prior Publication Data
US 2020/0052675 A1    Feb. 13, 2020

Related U.S. Application Data

(63) Continuation of application No. PCT/JP2018/016562, filed on Apr. 24, 2018.

(30) Foreign Application Priority Data

Apr. 28, 2017  (JP) .............................. JP2017-090499
Jun. 28, 2017  (JP) .............................. JP2017-126121

(51) Int. Cl.
*H03H 9/145*    (2006.01)
*H03H 9/64*     (2006.01)
(Continued)

(52) U.S. Cl.
CPC .......... *H03H 9/14552* (2013.01); *H03H 9/25* (2013.01); *H03H 9/6409* (2013.01); *H03H 9/6483* (2013.01); *H03H 9/72* (2013.01)

(58) Field of Classification Search
CPC ............. H03H 9/14552; H03H 9/6483; H03H 9/6409; H03H 9/25; H03H 9/72; H03H 9/542; H03H 9/725
(Continued)

(56) References Cited

U.S. PATENT DOCUMENTS

| 5,844,453 A | 12/1998 | Matsui et al. |
| 6,462,632 B1 | 10/2002 | Fujii et al. |
| 2002/0153969 A1 | 10/2002 | Inoue et al. |

FOREIGN PATENT DOCUMENTS

| JP | 05-145367 A | 6/1993 |
| JP | 08-330897 A | 12/1996 |

(Continued)

OTHER PUBLICATIONS

Machine English Translation of JP2005303893A, Published on Oct. 27, 2005 (Year: 2005).*

(Continued)

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An acoustic wave device includes an interdigital transducer electrode provided on a piezoelectric substrate, the interdigital transducer electrode includes first and second electrode fingers. The second electrode fingers are connected to an electric potential different from that of the first electrode fingers. A direction orthogonal or substantially orthogonal to a direction in which the first electrode fingers and the second electrode fingers extend is an acoustic wave propagation direction, the interdigital transducer electrode includes a first area centrally provided in the acoustic wave propagation direction, second areas provided on one side and another side of the first area in the acoustic wave propagation direction, and third areas each provided on a side of each of
(Continued)

the second areas opposite to the first area in the acoustic wave propagation direction.

18 Claims, 11 Drawing Sheets

(51) Int. Cl.
    *H03H 9/25*          (2006.01)
    *H03H 9/72*          (2006.01)

(58) Field of Classification Search
    USPC .................................................. 333/193–196
    See application file for complete search history.

(56) References Cited

FOREIGN PATENT DOCUMENTS

| | | |
|---|---|---|
| JP | 2000-315931 A | 11/2000 |
| JP | 2002-319842 A | 10/2002 |
| JP | 2005-303893 A | 10/2005 |
| JP | 2014-229916 A | 12/2014 |
| WO | 2011/105317 A1 | 9/2011 |

OTHER PUBLICATIONS

Official Communication issued in International Patent Application No. PCT/JP2018/016562 dated Jul. 10, 2018.

\* cited by examiner

ACOUSTIC WAVE DEVICE, FILTER, AND COMPOSITE FILTER DEVICE

CROSS REFERENCE TO RELATED APPLICATIONS

This application claims the benefit of priority to Japanese Patent Application No. 2017-090499 filed on Apr. 28, 2017 and Japanese Patent Application No. 2017-126121 filed on Jun. 28, 2017, and is a Continuation Application of PCT Application No. PCT/JP2018/016562 filed on Apr. 24, 2018. The entire contents of each application are hereby incorporated herein by reference.

BACKGROUND OF THE INVENTION

1. Field of the Invention

The present invention relates to an acoustic wave device in which an interdigital transducer electrode is provided on a piezoelectric substrate, and to a filter and a composite filter device each including such an acoustic wave device.

2. Description of the Related Art

In general, a plurality of filters that use acoustic wave devices has been used in an RF stage of a cellular phone or a smartphone. In this kind of filter, a plurality of acoustic wave devices formed of acoustic wave resonators are connected. Japanese Unexamined Patent Application Publication No. WO2011/105317A1 discloses an example of an acoustic wave resonator to be used as an acoustic wave device. In the acoustic wave device described in the Japanese Unexamined Patent Application Publication No. WO2011/105317A1, an interdigital transducer electrode and a pair of reflectors are provided on a piezoelectric substrate. In the interdigital transducer electrode, a plurality of first electrode fingers and a plurality of second electrode fingers, which is connected to an electric potential different from that of the first electrode finger, are alternately arranged in an acoustic wave propagation direction. In other words, a plurality electrode fingers are periodically arranged such that the electric potentials of electrode fingers adjacent to each other in the acoustic wave propagation direction are different.

In the interdigital transducer electrode, an acoustic wave is excited by applying an alternating-current electric field across a plurality of first electrode fingers and a plurality of second electrode fingers. However, the electrode fingers connected to the electric potentials are alternately arranged. Therefore, an acoustic wave device produces physical distortion due to nonlinearity. For that reason, characteristics of the acoustic wave device sometimes degrade. Further, in the case where a plurality of filters including a filter using such an acoustic wave device are connected in common at an antenna end side, characteristics of filters sometimes degrade. In other words, when one of the filters produces intermodulation distortion (IMD) due to the foregoing nonlinearity or harmonic distortion, the other filters sometimes suffer adverse effects. Particularly, when nonlinear distortion of the acoustic wave resonator closest to an antenna is large in a transmission filter, characteristics of the other filters such as a reception filter and the like sometimes suffer adverse effects. Note that it is known in the art that the product of the electrode finger intersecting width and the number of pairs needs to be increased in order to increase the linearity of an acoustic wave resonator. However, in this case, the impedance characteristic (admittance characteristic) of the acoustic wave resonator changes. To achieve desired filter characteristics using an acoustic wave device that uses an acoustic wave resonator, there is a need for an acoustic wave resonator capable of improving the nonlinearity without changing the admittance characteristic.

SUMMARY OF THE INVENTION

Preferred embodiments of the present invention provide acoustic wave devices with improved nonlinearity and provide filters and composite filter devices, each including such an acoustic wave device.

An acoustic wave device according to a preferred embodiment of the present invention include a piezoelectric substrate and an interdigital transducer electrode provided on or above the piezoelectric substrate. The interdigital transducer electrode includes a plurality of first electrode fingers and a plurality of second electrode fingers, the plurality of second electrode fingers being connected to an electric potential different from an electric potential of the plurality of first electrode fingers. A direction orthogonal or substantially orthogonal to a direction in which the first electrode finger and the second electrode finger extend is an acoustic wave propagation direction. The interdigital transducer electrode includes a first area centrally provided in the acoustic wave propagation direction, second areas provided on one side and another side of the first area in the acoustic wave propagation direction, and third areas each provided on a side of each of the second areas opposite to the first area in the acoustic wave propagation direction. In the second areas, the first electrode finger and the second electrode finger are alternately arranged in the acoustic wave propagation direction. In the first area and the third areas, adjacent electrode fingers in the acoustic wave propagation direction are connected to the same electric potential, or electrode fingers are not connected to any electric potential.

In a preferred embodiment of an acoustic wave device according to the present invention, in the first area and the third areas, adjacent electrode fingers in the acoustic wave propagation direction have the same electric potential. In this case, at least one of the first area and the third area may include a thick-width electrode finger having a larger width-direction dimension in the acoustic wave propagation direction than that of the electrode finger.

In a preferred embodiment of an acoustic wave device according to the present invention, at least one of the first area and the third area is defined by a floating electrode finger that is not connected to any electric potential.

In a preferred embodiment of an acoustic wave device according to the present invention, in both of the second areas, the electrode fingers arranged at respective end sections toward the first area are connected to the same electric potential.

In a preferred embodiment of an acoustic wave device according to the present invention, in both of the second areas, the electrode fingers arranged at respective end sections toward the first area are connected to different electric potentials.

In a preferred embodiment of an acoustic wave device according to the present invention, a total number of the electrode fingers in the first area is an odd number, and in both of the second areas, polarities of the electrode fingers arranged at respective end sections toward the first area are different from one another.

In a preferred embodiment of an acoustic wave device according to the present invention, a total number of the electrode fingers in the first area is an even number, and in both of the second areas, polarities of the electrode fingers arranged at respective end sections toward the first area are equal to one another.

A filters according to a preferred embodiment of the present invention includes a plurality of acoustic wave devices defined by acoustic wave resonators. Of the plurality of acoustic wave devices, at least one acoustic wave device includes a piezoelectric substrate, and an interdigital transducer electrode provided on or above the piezoelectric substrate. The interdigital transducer electrode includes a plurality of first electrode fingers and a plurality of second electrode fingers. The plurality of second electrode fingers are connected to an electric potential different from that of the plurality of first electrode fingers. A direction orthogonal or substantially orthogonal to a direction in which the first electrode finger and the second electrode finger extend is an acoustic wave propagation direction, the interdigital transducer electrode includes a first area centrally provided in the acoustic wave propagation direction, second areas provided on one side and another side of the first area in the acoustic wave propagation direction, and third areas each provided on a side of each of the second areas opposite to the first area in the acoustic wave propagation direction. In the second areas, the first electrode finger and the second electrode finger are alternately arranged in the acoustic wave propagation direction. In the first area and the third areas, adjacent electrode fingers in the acoustic wave propagation direction are connected to a same electric potential, or electrode fingers are not connected to any electric potential.

A composite filter device according to a preferred embodiment of the present invention includes n filters, with one-end portions of the n filters being connected in common and at least one of the n filters includes an acoustic wave device according to a preferred embodiment of the present invention.

In a preferred embodiment of a composite filter device according to the present invention, the composite filter device includes n filters and an antenna terminal to which one-end portions of the n filters are connected in common. At least one filter of the n filters includes at least one acoustic wave device, and in the at least one filter, the acoustic wave device closest to the antenna terminal is defined by an acoustic wave device according to a preferred embodiment of the present invention.

Acoustic wave devices according to preferred embodiments of the present invention enable the improvement of the nonlinearity. Accordingly, in the filters and the composite filter devices that including the acoustic wave devices according to preferred embodiments of the present invention, degradation of electrical characteristics is reduced or only barely occurs, and degradation of filter characteristics of the other filters is reduced or only barely occurs.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

In the following, the present invention is disclosed in detail by describing specific preferred embodiments of the present invention with reference to the drawings.

It is noted that each preferred embodiment described in the present specification is for illustrative purposes only, and the configurations of different preferred embodiments can be partially exchanged or combined.

Figure 1:
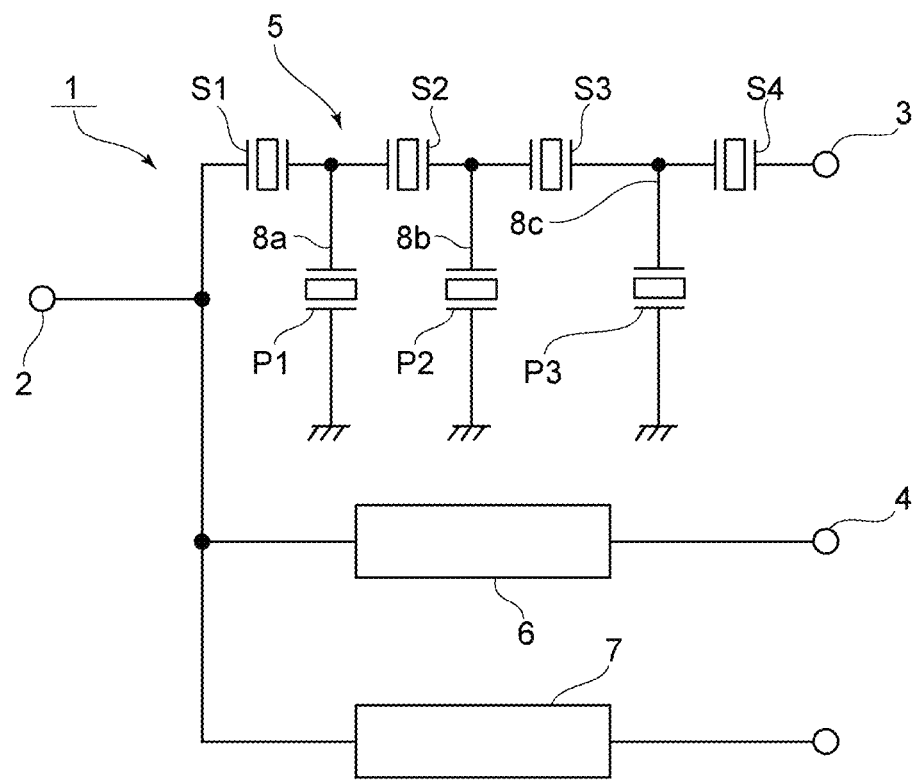
FIG. 1 is a circuit diagram of a composite filter device including an acoustic wave device according to a first preferred embodiment of the present invention.

FIG. 1 is a circuit diagram of a composite filter device including an acoustic wave device according to a first preferred embodiment of the present invention.

The composite filter device 1 includes a first filter 5, a second filter 6, and a third filter 7. In the present preferred embodiment, the first filter 5, the second filter 6, and the third filter 7 are each preferably a band pass type filter, for example.

The composite filter device 1 includes an antenna terminal 2. One-end portions of the first filter 5, the second filter 6, and the third filter 7 are electrically connected in common to the antenna terminal 2. The first filter 5 is a transmission filter. The first filter 5 includes a plurality of series arm resonators S1 to S4 and a plurality of parallel arm resonators P1, P2, and P3. Thus, the first filter 5 is a ladder acoustic wave filter. The first filter 5 is electrically connected to a transmission terminal 3. The second filter 6 is electrically connected to a reception terminal 4.

The series arm resonators S1 to S4 and the parallel arm resonators P1 to P3 are each preferably each defined as a one-port type acoustic wave resonator, for example.

In the composite filter device 1 the first filter 5, the series arm resonators S1 to S4, and the parallel arm resonators P1 to P3 are each preferably defined by an acoustic wave device according to a preferred embodiment of the present invention. This will be described in detail below using the series arm resonator S1 as a representative element.

Figure 2:
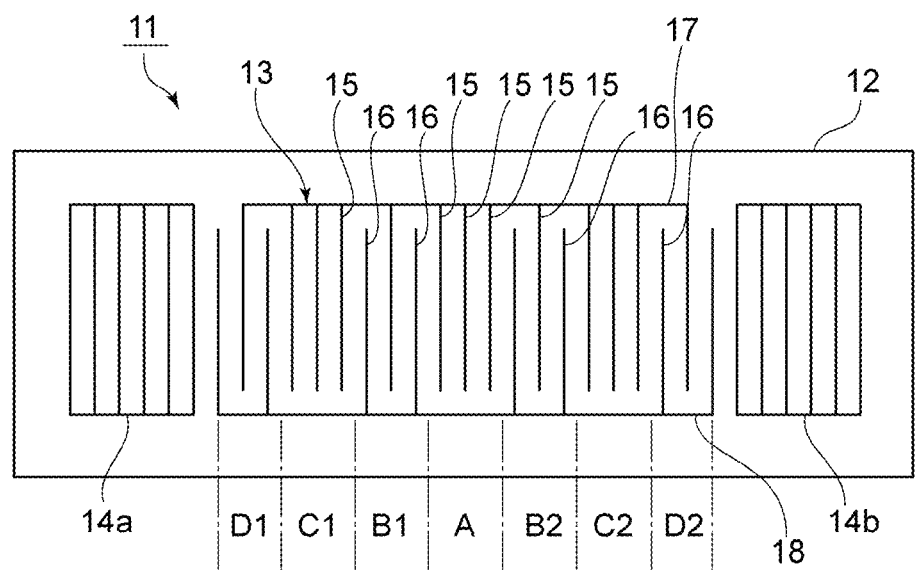
FIG. 2 is a plan view of the acoustic wave device according to the first preferred embodiment of the present invention.
Figure 3:
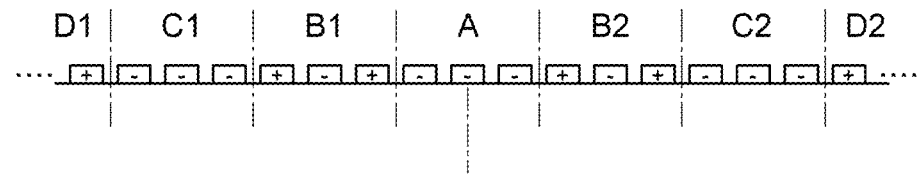
FIG. 3 is a schematic elevation view that describes a first area, a second area, and a third area in the acoustic wave device according to the first preferred embodiment of the present invention.

FIG. 2 is a plan view of an acoustic wave device 11 according to the first preferred embodiment, which defines the series arm resonator S1. FIG. 3 is a schematic elevation view that describes a first area, a second area, and a third area in the acoustic wave device according to the first preferred embodiment of the present invention. In the acoustic wave device 11, an interdigital transducer electrode 13 and reflectors 14a and 14b are provided on a piezoelectric substrate 12. The acoustic wave device 11 is preferably a one-port acoustic wave resonator. As described above, in acoustic wave devices, there is an issue of distortion due to nonlinearity of an interdigital transducer electrode. Whereas, in the acoustic wave device 11, the nonlinearity is improved because the interdigital transducer electrode 13 preferably has the following configuration.

The interdigital transducer electrode 13 includes a plurality of first electrode fingers 15 and a plurality of second electrode fingers 16. One-end portions of the plurality of first electrode fingers 15 are connected to a first busbar 17. One-end portions of the plurality of second electrode fingers 16 are connected to a second busbar 18.

Note that as described above, in prior art interdigital transducer electrodes, a plurality of first electrode fingers and a plurality of second electrode fingers are alternately arranged in an acoustic wave propagation direction. Whereas, in the interdigital transducer electrode 13, as illustrated in FIG. 2, in the first area A that is centrally positioned in the acoustic wave propagation direction, three first electrode fingers 15 are connected to the first busbar 17 such that adjacent first electrode fingers 15 are at the same electric potential. In other words, in the first area A, adjacent electrode fingers are connected to the same electric potential.

The second areas B1 and B2 are provided on both sides of the first area A in the acoustic wave propagation direction. In the second areas B1 and B2, the first electrode fingers 15 and the second electrode fingers 16 are alternately arranged in the acoustic wave propagation direction. Accordingly, in the second areas B1 and B2, an acoustic wave is excited when an alternating-current electric field is applied across the first electrode finger 15 and the second electrode finger 16.

The third areas C1 and C2 are provided next to the second areas B1 and B2 on the sides opposite to the first area A, respectively. As is the case with the first area A, in the third areas C1 and C2, one-end portions of a plurality of the first electrode fingers 15 are connected to the first busbar 17, and no second electrode finger 16 is provided therein. Accordingly, the nonlinearity is also improved in the third areas C1 and C2.

Fourth areas D1 and D2 are provided on the outer sides of the third areas C1 and C2 in the acoustic wave propagation direction, respectively. In the fourth areas D1 and D2, the first electrode fingers 15 and the second electrode fingers 16 are alternately arranged in the acoustic wave propagation direction. Accordingly, when activated, an acoustic wave is also excited in the fourth areas D1 and D2.

In the acoustic wave device 11, the nonlinearity is improved because the interdigital transducer electrode 13 includes the first area A and the third areas C1 and C2. For that reason, when activated, the distortion is reduced or only barely occurs. Particularly, when activated, a large stress is created at a center area of the interdigital transducer electrode 13 in the acoustic wave propagation direction. In other words, as described above, the first area A is configured to be a discontinuous portion that does not have a periodic structure of the first electrode fingers and the second electrode fingers, and this enables increasing the linearity more effectively.

Referring to a working example 1 and a comparative example 1 below, it is described that the nonlinearity is improved without bringing a change of the admittance characteristic or the impedance characteristic by using the foregoing acoustic wave device 11 according to the first preferred embodiment.

The acoustic wave device 11 of the working example 1 is fabricated using the following design parameters. As the piezoelectric substrate 12, $LiNbO_3$ is used. The wavelength λ determined by the electrode finger pitch is about 4.6 μm. The duty of the interdigital transducer electrode 13 is about 0.5. The total number of the electrode fingers in the interdigital transducer electrode 13 is 237. The number of the electrode fingers in each of the reflectors 14a and 14b is 10. In the interdigital transducer electrode 13, the number of the electrode fingers in the first area A is 11, the number of the electrode fingers in each of the second areas B1 and B2 is 51, the number of the electrode fingers in each of the third areas C1 and C2 is 11, and the number of the electrode fingers in each of the fourth areas D1 and D2 is 51. Further, the electrode finger intersecting width is about 110 μm.

For comparison, an acoustic wave device of the comparative example 1 is fabricated. The acoustic wave device of the comparative example 1 is similar to that of the foregoing working example 1 except that the electrode finger intersecting width is about 100 μm and that the first electrode fingers and the second electrode fingers are alternately arranged in the acoustic wave propagation direction even in the first area and the third area. Note that while the electrode finger intersecting width in the acoustic wave device of the comparative example 1 is about 100 μm, the electrode finger intersecting width in the working example 1 is adjusted to about 110 μm because of a difference in capacitance.

Figure 4:
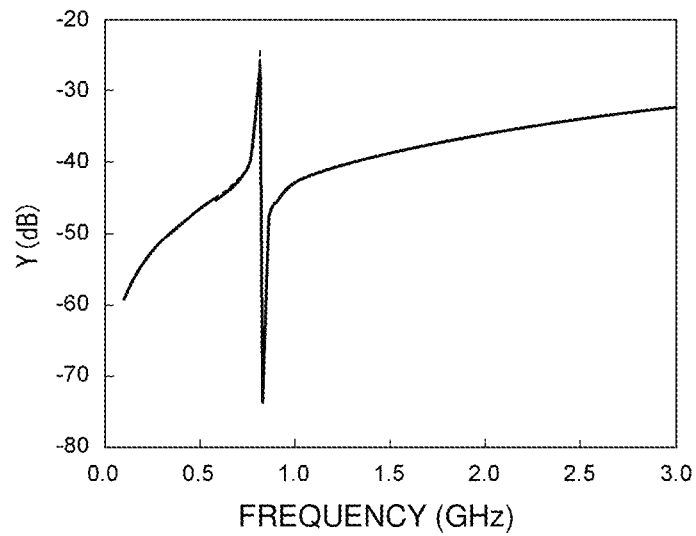
FIG. 4 is a diagram illustrating admittance characteristics of acoustic wave devices according to a working example 1 and a comparative example 1 of the present invention.

In FIG. 4, the solid line denotes the admittance characteristic of the working example 1, and the dashed line denotes the admittance characteristic of the comparative example 1. A frequency range between a resonant frequency and an anti-resonant frequency of the acoustic wave resonator of the foregoing working example 1 is about 800 MHz to about 900 MHz.

As is evident from FIG. 4, the solid line and the dashed line overlap almost completely, and it is discovered that the resonant characteristic of the acoustic wave device 11 of the working example 1 is identical or substantially identical to that of the acoustic wave device of the comparative example 1.

Figure 5:
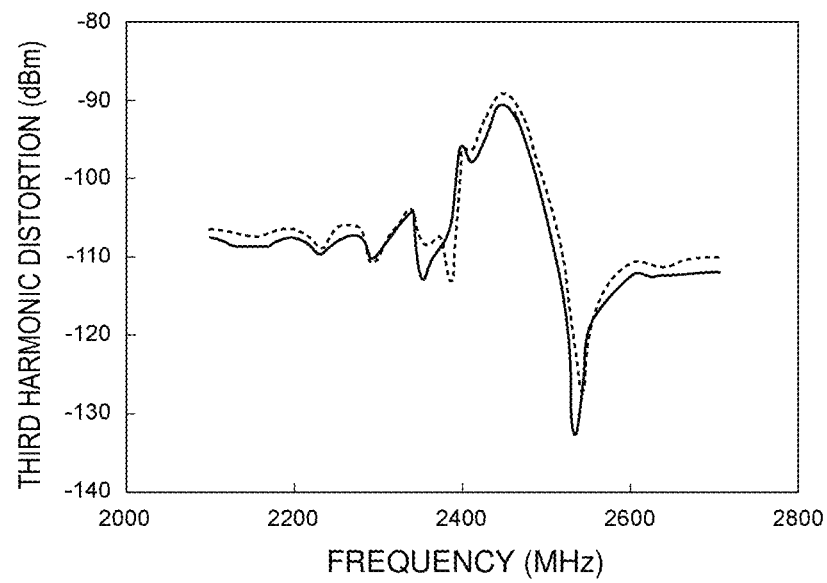
FIG. 5 is a diagram illustrating frequency characteristics of third harmonic distortion in the acoustic wave devices according to the working example 1 and the comparative example 1.
Figure 6:
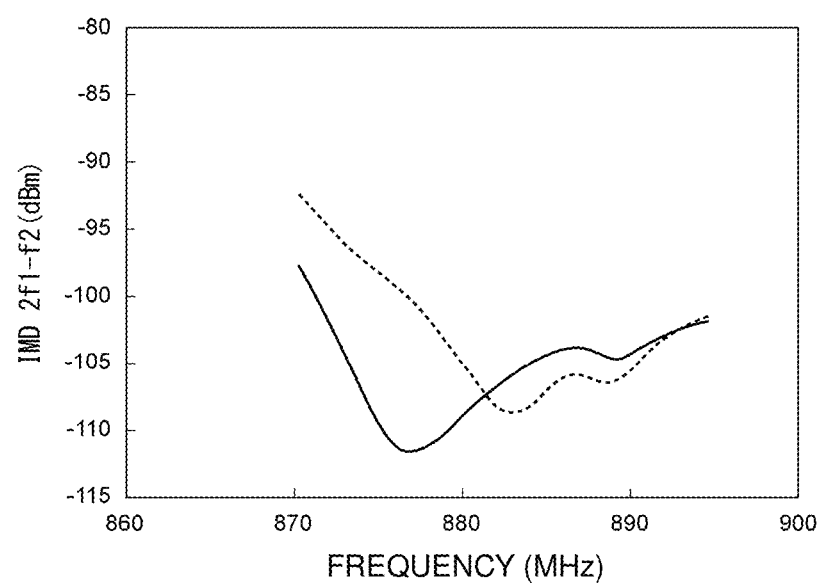
FIG. 6 is a diagram illustrating IMD characteristics of the acoustic wave devices according to the working example 1 and the comparative example 1.

FIG. 5 is a diagram illustrating the frequency characteristics of third harmonic distortion in the acoustic wave devices according to the working example 1 and the comparative example 1, and FIG. 6 is a diagram illustrating IMD characteristics thereof. The solid line denotes a result of the working example 1, and the dashed line denotes a result of the comparative example 1. As is clear from FIG. 5 and FIG. 6, it is discovered that the working example 1 enables reducing the third harmonic distortion and has an improved IMD characteristic compared with the comparative example 1.

Note that the frequency range of the third harmonic wave appears in the range of about 2400 MHz to about 2700 MHz.

Further, when IMD=2f1−f2, f1=about 825 MHz to about 849 MHz, and f2=about 870 MHz to about 894 MHz. Accordingly, 2f1−f2=about 780 MHz to about 804 MHz.

Figure 7:
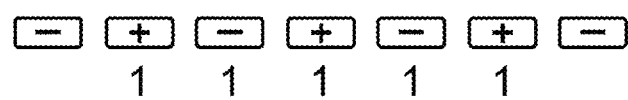
FIG. 7 is a schematic diagram that describes polarities of electrode fingers of an interdigital transducer electrode in the comparative example 1.
Figure 8:
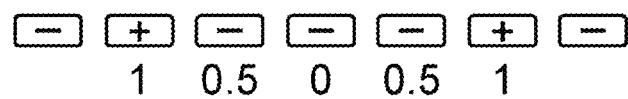
FIG. 8 is a schematic diagram that describes polarities of electrode fingers of an interdigital transducer electrode in an acoustic wave device according to the first preferred embodiment of the present invention.

Referring to FIG. 7 and FIG. 8, a mechanism that improves the nonlinearity of the acoustic wave device 11 as described above is now described.

FIG. 7 is a schematic diagram illustrating the polarities of a plurality of electrode fingers of the interdigital transducer electrode in the acoustic wave device of the comparative example 1, and FIG. 8 is a schematic diagram illustrating the polarities of a plurality of electrode fingers of the interdigital transducer electrode of the acoustic wave device 11 according to the first preferred embodiment in the vicinity of the first area A. In FIG. 7 and FIG. 8, the excitation strength is schematically represented using "1", "0.5", and "0". In other words, in the case where the polarities of adjacent electrode fingers are being inverted, the excitation strength is equal to 1, and in the case where the polarities of adjacent electrode fingers are the same, the excitation strength is equal to 0. As illustrated in FIG. 7, in the acoustic wave device of the comparative example 1, the polarities of adjacent electrode fingers are being inverted. Thus, the excitation strength is high, but the nonlinearity is also high. Whereas, as illustrated in FIG. 8, in the first preferred embodiment, in the first area A, the polarities of adjacent electrode fingers are equal to each other. Thus, the excitation strength is lower, but this increases the linearity. Further, the first area A is centrally provided in the acoustic wave propagation direction. This enables a more effective improvement of the linearity in the center area where the stress is large. Note that the case where the polarities of one electrode finger and another electrode finger are being inverted is a case where the busbar connected to the one electrode finger is different from the busbar connected to the another electrode finger (for example, a case where the one electrode finger is connected to the first busbar 17 and the another electrode finger is connected to the second busbar 18). Further, the case where the polarities of one electrode finger and another electrode finger are the same is a case where the busbar connected to the one electrode finger is the same as the busbar connected to the another electrode finger (for example, a case where the one electrode finger and the another electrode finger are connected to the first busbar 17).

Note that in the acoustic wave device 11, the electrode finger arranged at the end section of the second area B1 toward the first area A is the second electrode finger 16, and the electrode finger arranged at the end section of the second area B2 toward the first area A is also the second electrode finger 16. Thus, both the electrode fingers have the same polarity.

Figure 9:
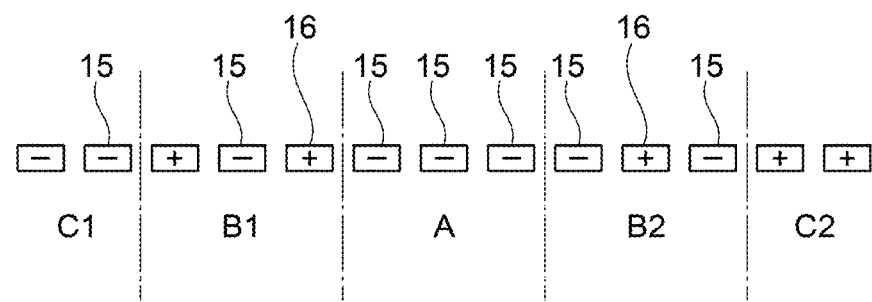
FIG. 9 is a schematic diagram that describes polarities of electrode fingers of the interdigital transducer electrode in the acoustic wave device according to the first preferred embodiment of the present invention.

However, for the waves propagating from the second area B1 to the second area B2 through the first area A, it is preferable that the polarity of the second area B1 is different from the polarity of the second area B2. As illustrated in FIG. 9, in the case where the number of electrode fingers of the interdigital transducer electrode in the first area A is an odd number, it is preferable that the electrode finger at the end section of the second area B1 toward the first area A is the second electrode finger 16, and the electrode finger at the end section of the second area B2 toward the first area A is the first electrode finger 15. In other words, it is preferable that the polarity of the electrode finger at the end section of the second area B1 toward the first area A is different from the polarity of the electrode finger at the end section of the second area B2 toward the first area A. In the case where the number of electrode fingers of the interdigital transducer electrode in the first area A is an even number, it is preferable that the electrode finger at the end section of the second area B1 toward the first area A is the second electrode finger 16, and the electrode finger at the end section of the second area B2 toward the first area A is the second electrode finger 16. In other words, it is preferable that the polarity of the electrode finger at the end section of the second area B1 toward the first area A is the same as the polarity of the electrode finger at the end section of the second area B2 toward the first area A. In both cases, harmonic waves reflected at the reflectors and passed through the first area A cancel each other out, thus enabling to obtain better characteristics. This is described with reference to FIG. 10.

Figure 10:
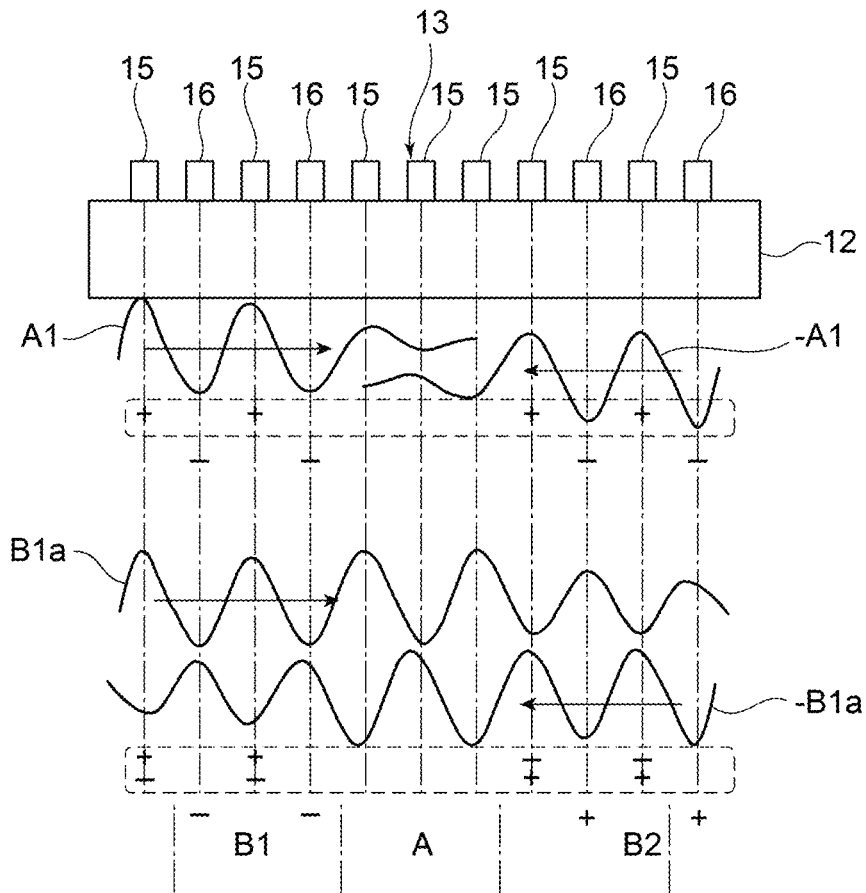
FIG. 10 is a schematic diagram that describes a main mode acoustic wave reflected from reflectors at both sides and a propagation state of a higher-order mode in the acoustic wave device according to the first preferred embodiment of the present invention.
Figure 11:
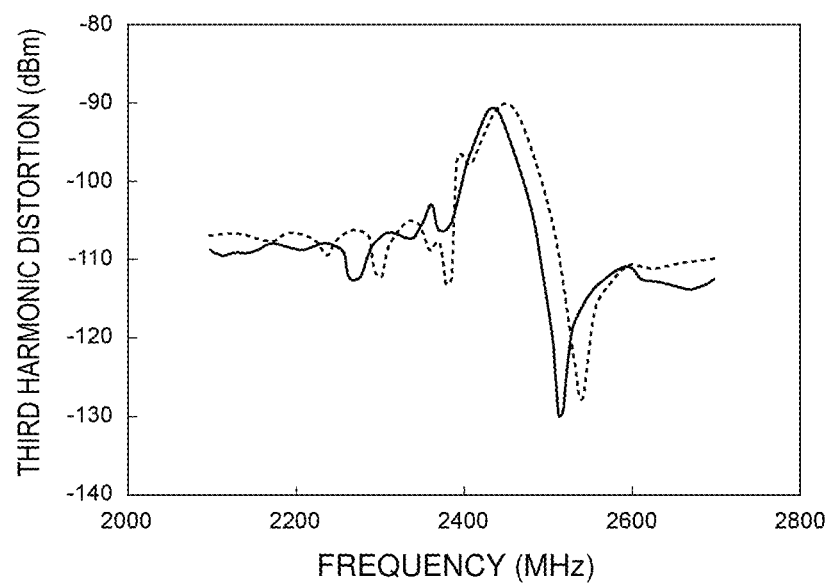
FIG. 11 is a diagram illustrating frequency characteristics of third harmonic distortion in an acoustic wave device of a working example 2 according to the first preferred embodiment of the present invention and an acoustic wave device of the comparative example 1.
Figure 12:
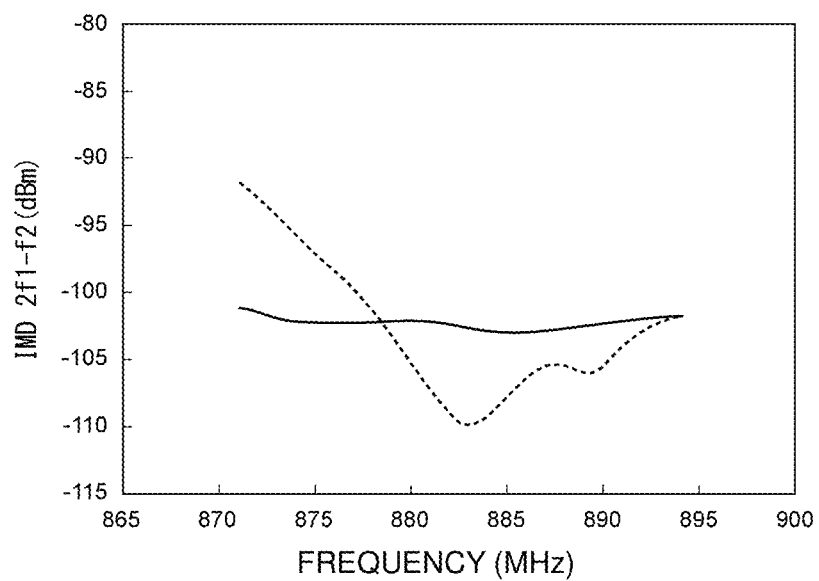
FIG. 12 is a diagram illustrating IMD characteristics of the acoustic wave device of the working example 2 according to the first preferred embodiment of the present invention and the acoustic wave device of the comparative example 1.

As illustrated in FIG. 10, when the interdigital transducer electrode 13 is activated, a main mode acoustic wave excited in the second area B1 and a main mode acoustic wave excited in the second area B2 respectively propagate to the directions denoted by arrows illustrated in FIG. 10. In this case, the reflection coefficient of a main mode acoustic wave in the interdigital transducer electrode 13 is large. Therefore, the acoustic wave denoted by the arrow A1 is reflected in the area A and returns to the area B1, and similarly the acoustic wave denoted by the arrow −A1 is also reflected in the area A and returns to the area B2. As a result, the main mode acoustic waves do not cancel each other out. Whereas, in higher order modes, a higher-order mode denoted by the arrow B1a and a higher-order mode by the arrow −B1a propagate respective arrow directions. However, the reflection coefficient of a higher-order mode in the interdigital transducer electrode 13 is small. Therefore, each higher-order mode passes through the area A, and these two higher-order modes are in opposite phases. For that reason, the higher-order mode response can be effectively reduced or prevented. As described above, for the waves propagating from the second area B1 to the second area B2 through the first area A, it is preferable that the polarity of the second area B1 is different from the polarity of the second area B2. Referring to FIG. 11 and FIG. 12, a working example 2 that exemplifies a preferable acoustic wave device and the comparative example 1 are described.

The parameters of the working example 2 are similar to those of the working example 1 except the polarities of the electrode fingers at the respective end sections of the second areas B1 and B2 toward the first area A are opposite polarities. The admittance characteristics of the acoustic wave device of the working example 2 and the acoustic wave device of the comparative example 1 overlap almost completely with the admittance characteristic of the working example 1 illustrated in FIG. 4. On the other hand, FIG. 11 is a diagram illustrating the frequency characteristics of third harmonic distortion in the acoustic wave devices of the working example 2 and the comparative example 1, and FIG. 12 is a diagram illustrating IMD characteristics thereof. In FIG. 11 and FIG. 12, the solid line denotes a result of the working example 2, and the dashed line denotes a result of the comparative example 1. As is clear from FIG. 11, the working example 2 can also reduce the third harmonic distortion compared with the comparative example 1. Further, as illustrated in FIG. 12, the working example 2 can also improve the IMD characteristic compared with the comparative example 1. In other words, because of the improvement of the linearity in the interdigital transducer electrode, the frequency characteristic of the third harmonic distortion and the IMD characteristic are improved.

Second Preferred Embodiment

Figure 13:
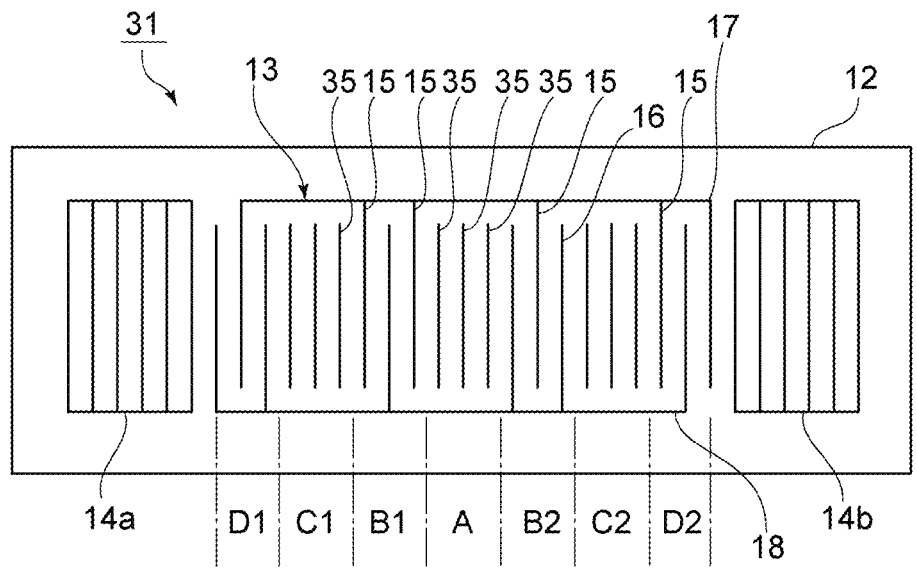
FIG. 13 is a plan view of an acoustic wave device according to a second preferred embodiment of the present invention.

FIG. 13 is a plan view of an acoustic wave device 31 according to a second preferred embodiment of the present invention. In the acoustic wave device 31, a plurality of floating electrode fingers 35 are provided in the first area A and the third areas C1 and C2. The floating electrode finger 35 is not electrically connected to the first busbar 17 or the second busbar 18. In other words, the floating electrode finger 35 is electrically floating. Accordingly, for example, in the first area A, a reflector includes a plurality of floating electrode fingers 35. Similarly, in the third areas C1 and C2, a reflector includes a plurality of floating electrode fingers 35.

In the acoustic wave device 31, the second areas B1 and B2 and the fourth areas D1 and D2 are configured similarly to those of the acoustic wave device 11.

In the acoustic wave device 31, the first area A and the third areas C1 and C2 are discontinuous portions of electrode period in the interdigital transducer electrode 13. In other words, in the electrode structure in which the first electrode fingers 15 and the second electrode fingers 16 are alternately arranged, the first area A and the third areas C1 and C2 are discontinuous portions in this periodic structure. Further, in the first area A and the third areas C1 and C2, no acoustic wave is excited by piezoelectric effect, and thus the linearity is increased. Accordingly, as in the case with the acoustic wave device 11, the nonlinearity is improved in the acoustic wave device 31. As described above, in preferred embodiments of the present invention, the nonlinearity may be improved by not connecting the electrode finger to any other electric potential in the first area A and the third areas C1 and C2.

Figure 14:
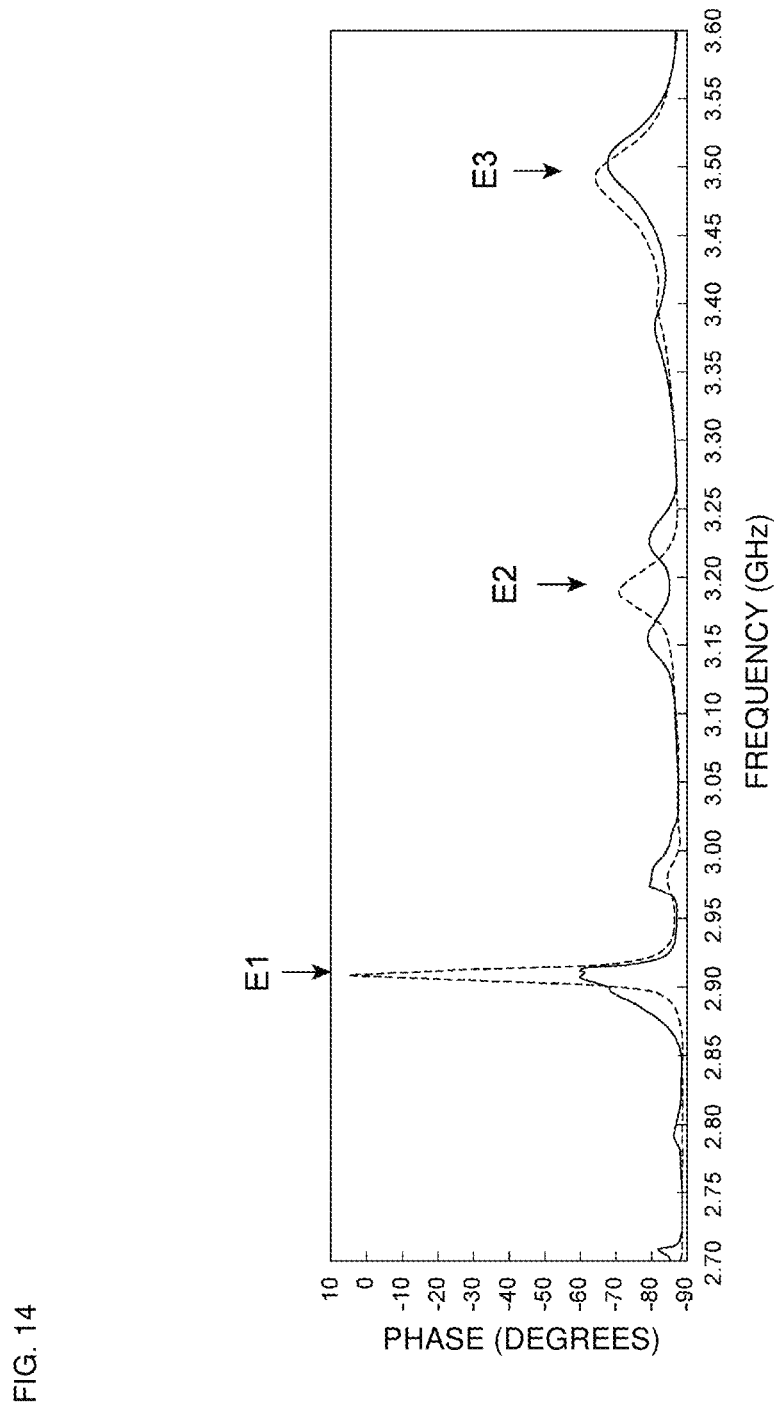
FIG. 14 is a diagram illustrating phase characteristics of a working example 3 of the acoustic wave device according to the second preferred embodiment of the present invention and a comparative example 2.

The phase characteristics of a working example 3 of the acoustic wave device 31 according to the second preferred embodiment and a comparative example 2 are illustrated in FIG. 14.

Note that the parameters of the working example 3 are similar to those of the working example 1 except that the first area A and the third areas C1 and C2 are configured in the following manner:

First area A: Eleven floating electrode fingers are provided.

Third area C1, C2: Eleven floating electrode fingers are provided.

The polarity of the electrode finger disposed at the end section of the second area B1 toward the first area A is different from the polarity of the electrode finger disposed at the end section of the second area B2 toward the first area A.

The polarity of the electrode finger disposed at the end section of the fourth area D1 toward the third area C1 is different from the polarity of the electrode finger disposed at the end section of the second area B1 toward the third area C1.

The polarity of the electrode finger disposed at the end section of the fourth area D2 toward the third area C2 is different from the polarity of the electrode finger disposed at the end section of the second area B2 toward the third area C2.

In FIG. 14, the solid line denotes a result of the working example 3, and the dashed line denotes a result of the comparative example 2. Note that the working example 3 is designed such that the resonant frequency is about 2450 MHz. Arrows E1 to E3 in FIG. 14 all denote responses to unwanted waves. It is discovered that the working example 3 enables effective reduction or prevention of the unwanted waves denoted by the arrows E1 to E3 compared with the comparative example 2. Employing the configuration described above enables the unwanted waves in a plurality of the areas to be canceled out. In other words, the higher-order mode entering the second area B2 from the second area B1 through the first area A and the higher-order mode in the second area B2 cancel each other out. The higher-order mode entering the second area B1 from the fourth area D1 through the third area C1 and the higher-order mode in the second area B1 cancel each other out. The higher-order mode entering the second area B2 from the fourth area D2 through the third area C2 and the higher-order mode in the second area B2 cancel each other out. Accordingly, the unwanted waves are effectively reduced or prevented.

Figure 15:
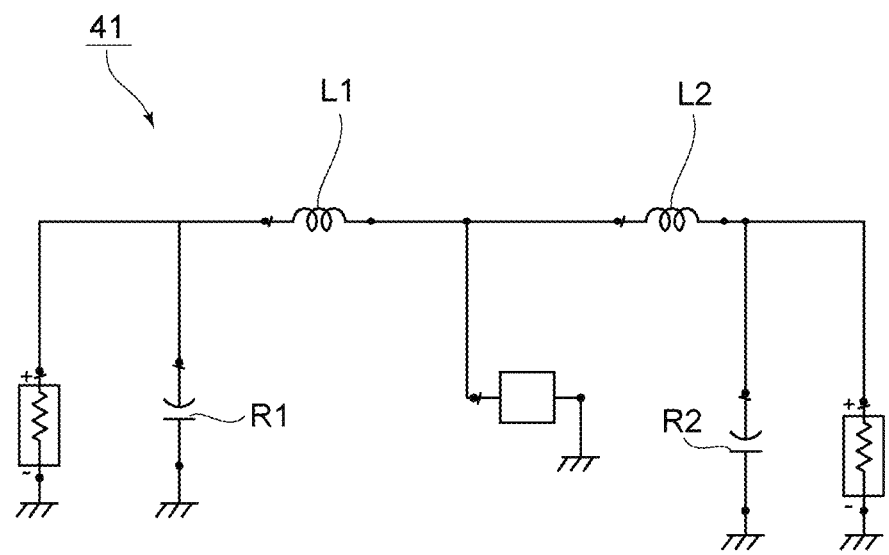
FIG. 15 is a circuit diagram of a notch filter that serves as a band pass type filter that uses the acoustic wave device according to the second preferred embodiment of the present invention.

FIG. 15 is a circuit diagram of a notch filter according to the second preferred embodiment of the present invention. The notch filter 41 is a low pass filter including inductances L1 and L2 provided in series arms and electrostatic capacitances provided in parallel arms. Here, portions of the electrostatic capacitances provided in the parallel arms are replaced by resonators R1 and R2. The notch filter 41 is configured so as to have a steep attenuation characteristic near about 2.4 GHz that is a resonant frequency of the resonators R1 and R2. This allows a signal in a frequency band of about 2.5 GHz to about 3.3 GHz to pass. Note that the electrostatic capacitances of the resonators R1 and R2 are referred to as C1$a$ and C2$a$, respectively. Further, inductance values of the inductances L1 and L2 are referred to as L1$a$ and L2$a$, respectively.

A working example 4 that serves as a working example of the second preferred embodiment and a comparative example 3 are fabricated using the following parameters.

In the working example 4, L1a and L2a are each about 1.5 nH, and C1a and C2a are each about 1.5 pF. The resonators R1 and R2 are defined by the acoustic wave device 31 of the working example 3.

In the comparative example 3, L1a and L2a are each about 1.5 nH, and C1a and C2a are each about 1.5 pF. The resonators R1 and R2 are similar to the acoustic wave device 31 of the working example 3, except that the resonators R1 and R2 are configured in the following manner.

The polarity of the electrode finger disposed at the end section of the second area B1 toward the first area A is the same as the polarity of the electrode finger disposed at the end section of the second area B2 toward the first area A.

The polarity of the electrode finger disposed at the end section of the fourth area D1 toward the third area C1 is the same as the polarity of the electrode finger disposed at the end section of the second area B1 toward the third area C1.

The polarity of the electrode finger disposed at the end section of the fourth area D2 toward the third area C2 is the same as the polarity of the electrode finger disposed at the end section of the second area B2 toward the third area C2.

Figure 16:
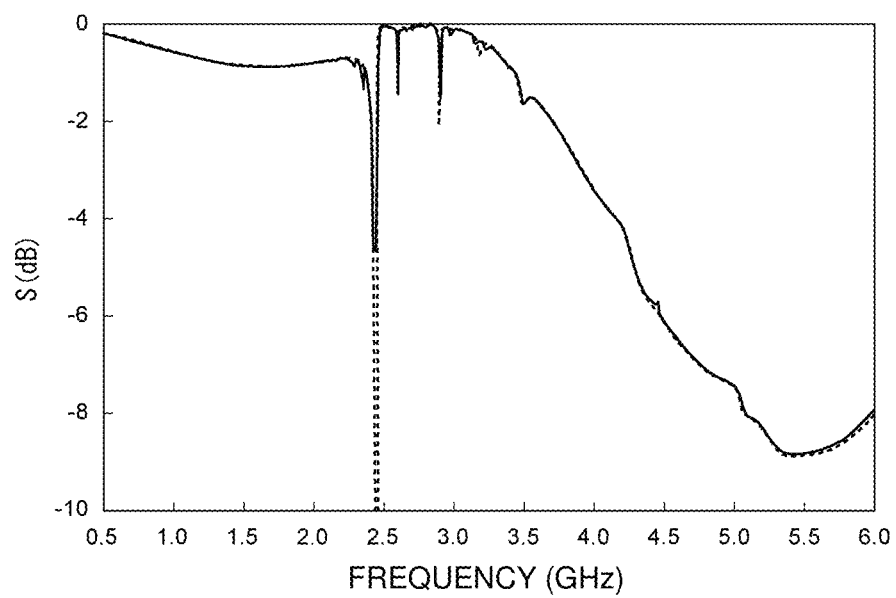
FIG. 16 is a diagram illustrating bandpass characteristics of a working example 4 of the notch filter illustrated in FIG. 15 and a comparative example 3.
Figure 17:
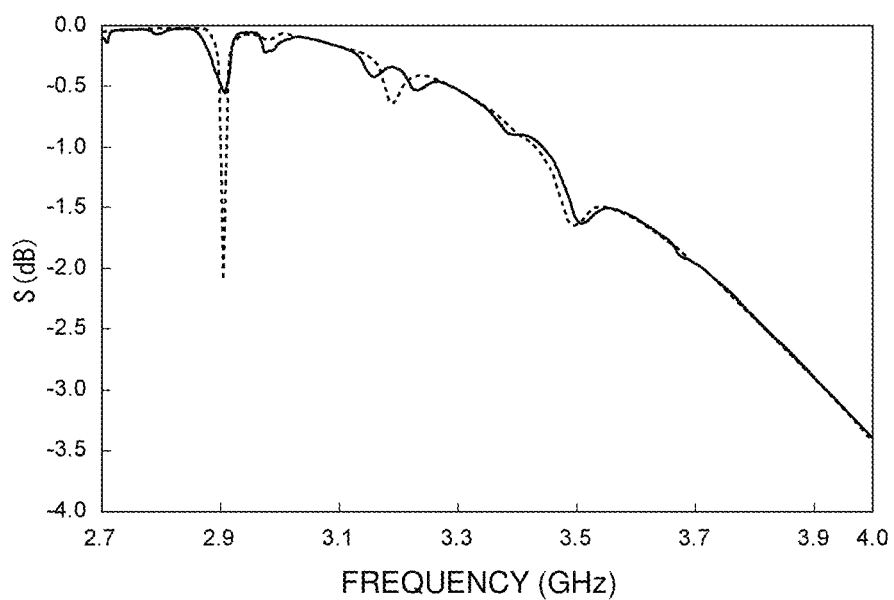
FIG. 17 is a diagram illustrating an enlarged view of a part of the bandpass characteristic illustrated in FIG. 16.

FIG. 16 illustrates bandpass characteristics of notch filters of the working example 4 and the comparative example 3, and FIG. 17 is a diagram illustrating an enlarged view of a part of FIG. 16. Note that the solid line denotes a result of the working example 4, and the dashed line denotes a result of the comparative example 3.

From FIG. 16 and FIG. 17, it is discovered that near 2.7 GHz to 3.3 GHz which is a pass band, the working example 4 enables drastically reduction of local degradation of insertion loss due to unwanted waves.

In the foregoing first preferred embodiment and the foregoing second preferred embodiment, as interposed discontinuous portions in the first area A and the third areas C1 and C2, the configuration in which adjacent electrode fingers are connected to the same electric potential and a plurality of floating electrode fingers are illustrated. However, it is not particularly limited to these formation patterns. For example, in FIG. 2, gaps between three adjacent first electrode fingers 15 that are at the same electric potential may be metallized. In other words, the gap between the first electrode fingers 15 on both sides in the acoustic wave propagation direction may be defined by a metal film. In this case, an electrode finger having the maximum electrode finger width in the interdigital transducer electrode 13 is provided, and this electrode finger is a thick-width electrode finger (fill electrode) that has an electrode finger width wider than about twice the average electrode finger width of the electrode fingers not including this electrode finger. Further, as in a first modified example illustrated in FIG. 18, the first area may be defined by only a single floating electrode finger 35. Further, as in a second modified example illustrated in FIG. 19, gaps between adjacent floating electrode fingers 35 may be metallized in the first area. In this case, as illustrated in FIG. 19, the gap between the floating electrode fingers 35 on both sides in the acoustic wave propagation direction is defined by a metal film. Further, to cause the electric potentials of at least some of the plurality of floating electrode fingers to be the same, the at least some of the plurality of floating electrode fingers may be electrically connected to each other at end portions in an intersecting width direction. Note that in FIG. 18 and FIG. 19, the excitation strength of the floating electrode finger 35 is denoted by x1.

Figure 18:
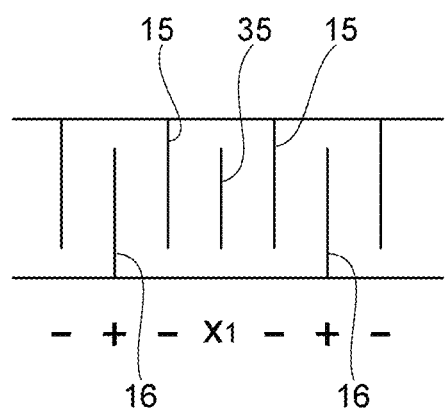
FIG. 18 is a schematic plan view illustrating a first modified example of configuration of a continuous area that serves as the first area.
Figure 19:
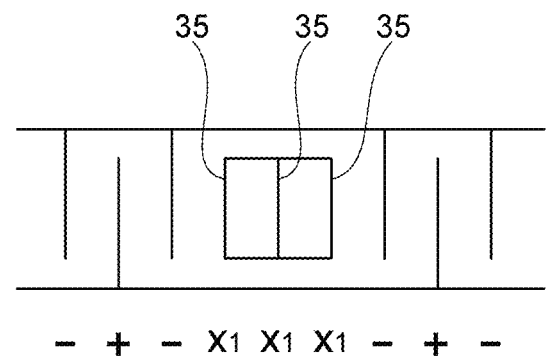
FIG. 19 is a schematic plan view illustrating a second modified example of the configuration of the continuous area that serves as the first area.

Further, in each of the configurations illustrated in the first preferred embodiment, the second preferred embodiment, FIG. 18, and FIG. 19, it is preferable that the electrode fingers disposed at the respective end sections of the second areas B1 and B2 toward the first area A, which are arranged both sides of the first area A, have different polarities, as described above. However, the polarities may alternatively be the same.

Figure 20:
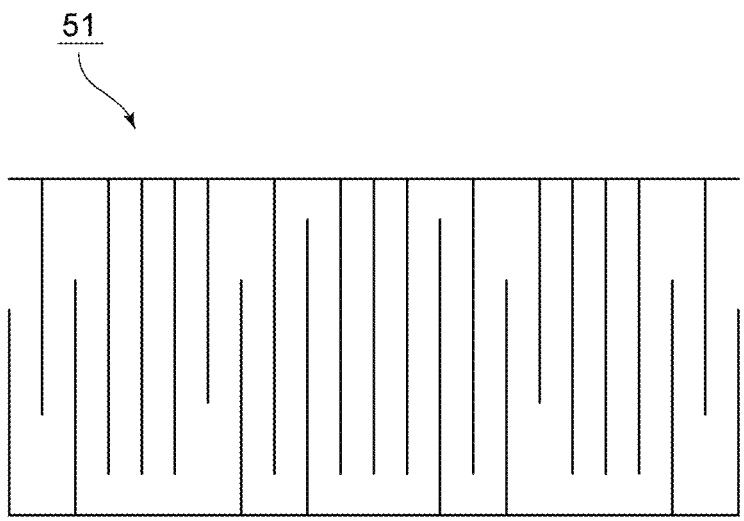
FIG. 20 is a schematic plan view illustrating a modified example of an interdigital transducer electrode to be used in an acoustic wave device according to the present invention.
Figure 21:
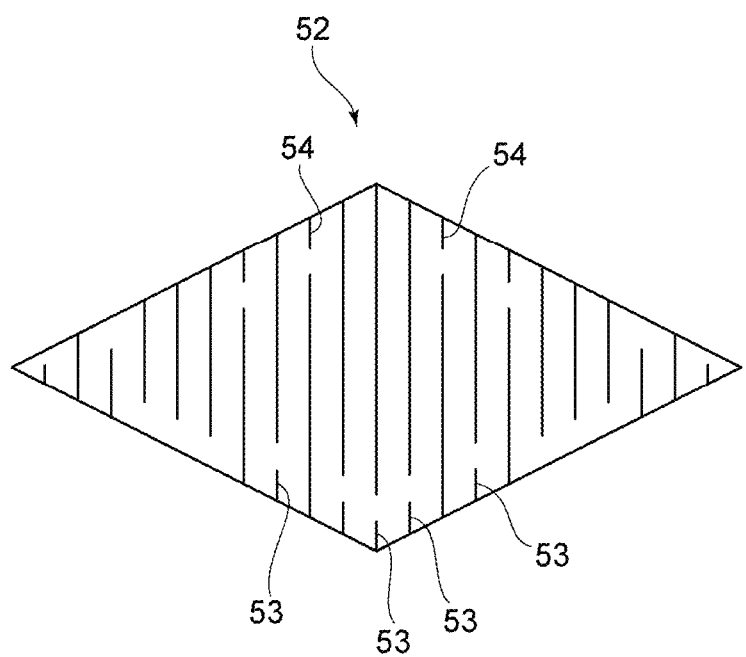
FIG. 21 is a schematic plan view illustrating another modified example of the interdigital transducer electrode to be used in an acoustic wave device according to the present invention.

Further, as illustrated in FIG. 20, in an interdigital transducer electrode 51, apodization weighting may be applied. Alternatively, as in an interdigital transducer electrode 52 illustrated in FIG. 21, apodization weighting may be applied, and further the busbar may be inclined with respect to the acoustic wave propagation direction. Further, as in the interdigital transducer electrode 52, first and second dummy electrode fingers 53 and 54 may be provided therein.

Further, the piezoelectric material layer that excites an acoustic wave may preferably be, for example, lithium tantalite, lithium niobate, crystal, and the like, but is not limited thereto. Further, for example, a multilayer structure in which a dielectric film made of, for example, silicon oxide, silicon nitride, or the like may be provided on a piezoelectric material layer that is likely to generate a higher-order mode, or a multilayer structure in which a piezoelectric material layer is attached to a supporting substrate made of silicon, alumina, sapphire, or the like may preferably be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An acoustic wave device comprising:
   a piezoelectric substrate; and
   an interdigital transducer electrode provided on or above the piezoelectric substrate; wherein
   the interdigital transducer electrode includes a plurality of first electrode fingers and a plurality of second electrode fingers, the plurality of second electrode fingers being connected to an electric potential different from an electric potential connected to the plurality of first electrode fingers;
   a direction orthogonal or substantially orthogonal to a direction in which the first electrode fingers and the second electrode fingers extend is an acoustic wave propagation direction;
   the interdigital transducer electrode includes a first area centrally provided in the acoustic wave propagation direction, second areas provided on one side and another side of the first area in the acoustic wave propagation direction, and third areas provided on a side of each of the second areas opposite to the first area in the acoustic wave propagation direction;
   in the second areas, the first electrode finger and the second electrode finger are alternately arranged in the acoustic wave propagation direction;
   in the first area and the third areas, adjacent electrode fingers in the acoustic wave propagation direction are connected to a same electric potential, or electrode fingers are not connected to any electric potential; and
   a total number of the electrode fingers in the first area is an odd number, and in both of the second areas, polarities of the electrode fingers disposed at respective end sections toward the first area are different from one another.

2. The acoustic wave device according to claim 1, wherein in the first area and the third areas, adjacent electrode fingers in the acoustic wave propagation direction are at a same electric potential.

3. The acoustic wave device according to claim 2, wherein at least one of the first area or the third areas include a thick electrode finger having a larger width-direction dimension in the acoustic wave propagation direction than a width-direction dimension of the first electrode fingers and the second electrode fingers in the second areas.

4. The acoustic wave device according to claim 1, wherein at least one of the first area or the third areas includes a floating electrode finger that is not connected to any electric potential.

5. The acoustic wave device according to claim 1, wherein in both of the second areas, the electrode fingers disposed at respective end sections toward the first area are connected to different electric potentials.

6. A composite filter device comprising:
n filters, wherein
one-end portions of the n filters are electrically connected in common; and
at least one of the n filters includes the acoustic wave device according to claim 1.

7. A composite filter device comprising:
n filters; and
an antenna terminal to which one-end portions of the n filters are electrically connected in common; wherein
at least one filter of the n filters includes at least one acoustic wave device, and in the at least one filter, the acoustic wave device closest to the antenna terminal is defined by the acoustic wave device according to claim 1.

8. The acoustic wave device according to claim 1, wherein fourth areas are provided on outer sides of the third areas in the acoustic wave propagation direction, respectively; and
in the fourth areas, the first electrode fingers and the second electrode fingers are alternately arranged in the acoustic wave propagation direction.

9. The acoustic wave device according to claim 8, wherein a polarity of one of the first and second electrode fingers disposed at an end section of the fourth area toward the third area is different from a polarity of another one of the electrode fingers disposed at an end section of the second area toward the third area.

10. An acoustic wave device comprising:
a piezoelectric substrate; and
an interdigital transducer electrode provided on or above the piezoelectric substrate; wherein
the interdigital transducer electrode includes a plurality of first electrode fingers and a plurality of second electrode fingers, the plurality of second electrode fingers being connected to an electric potential different from an electric potential connected to the plurality of first electrode fingers;
a direction orthogonal or substantially orthogonal to a direction in which the first electrode fingers and the second electrode fingers extend is an acoustic wave propagation direction;
the interdigital transducer electrode includes a first area centrally provided in the acoustic wave propagation direction, second areas provided on one side and another side of the first area in the acoustic wave propagation direction, and third areas provided on a side of each of the second areas opposite to the first area in the acoustic wave propagation direction;
in the second areas, the first electrode finger and the second electrode finger are alternately arranged in the acoustic wave propagation direction;
in the first area and the third areas, adjacent electrode fingers in the acoustic wave propagation direction are connected to a same electric potential, or electrode fingers are not connected to any electric potential; and
a total number of the electrode fingers in the first area is an even number, and in both of the second areas, polarities of the electrode fingers disposed at respective end sections toward the first area are equal to one another.

11. The acoustic wave device according to claim 10, wherein in the first area and the third areas, adjacent electrode fingers in the acoustic wave propagation direction are at a same electric potential.

12. The acoustic wave device according to claim 11, wherein at least one of the first area or the third areas include a thick electrode finger having a larger width-direction dimension in the acoustic wave propagation direction than a width-direction dimension of the first electrode fingers and the second electrode fingers in the second areas.

13. The acoustic wave device according to claim 10, wherein at least one of the first area or the third areas includes a floating electrode finger that is not connected to any electric potential.

14. The acoustic wave device according to claim 10, wherein in both of the second areas, the electrode fingers disposed at respective end sections toward the first area are connected to a same electric potential.

15. A composite filter device comprising:
n filters, wherein
one-end portions of the n filters are electrically connected in common; and
at least one of the n filters includes the acoustic wave device according to claim 10.

16. A composite filter device comprising:
n filters; and
an antenna terminal to which one-end portions of the n filters are electrically connected in common; wherein
at least one filter of the n filters includes at least one acoustic wave device, and in the at least one filter, the acoustic wave device closest to the antenna terminal is defined by the acoustic wave device according to claim 10.

17. The acoustic wave device according to claim 10, wherein
fourth areas are provided on outer sides of the third areas in the acoustic wave propagation direction, respectively; and
in the fourth areas, the first electrode fingers and the second electrode fingers are alternately arranged in the acoustic wave propagation direction.

18. The acoustic wave device according to claim 17, wherein a polarity of one of the first and second electrode fingers disposed at an end section of the fourth area toward the third area is different from a polarity of another one of the electrode fingers disposed at an end section of the second area toward the third area.

* * * * *